(12) United States Patent
Sukharev et al.

(10) Patent No.: US 6,777,807 B1
(45) Date of Patent: Aug. 17, 2004

(54) INTERCONNECT INTEGRATION

(75) Inventors: Valeriy Sukharev, Cupertino, CA (US); Wilbur G. Catabay, Saratoga, CA (US); Hongqiang Lu, Gresham, OR (US)

(73) Assignee: LSI Logic Corporation, Milpitas, CA (US)

(*) Notice: Subject to any disclaimer, the term of this patent is extended or adjusted under 35 U.S.C. 154(b) by 25 days.

(21) Appl. No.: 10/448,082

(22) Filed: May 29, 2003

(51) Int. Cl.[7] .............................................. H01L 23/48
(52) U.S. Cl. .................... 257/751; 257/750; 257/758; 257/763; 257/764; 257/785
(58) Field of Search .............................. 257/751, 750, 257/763, 764, 765, 758, 752, 762

(56) References Cited

U.S. PATENT DOCUMENTS

| | | | |
|---|---|---|---|
| 5,470,789 A | * 11/1995 | Misawa ...................... 438/643 |
| 6,046,108 A | * 4/2000 | Liu et al. .................... 438/687 |
| 6,130,157 A | * 10/2000 | Liu et al. .................... 438/669 |
| 6,214,728 B1 | * 4/2001 | Chan et al. ................. 438/678 |
| 6,368,951 B2 | * 4/2002 | Higashi et al. ............. 438/618 |
| 6,423,625 B1 | * 7/2002 | Jang et al. .................. 438/614 |
| 6,600,229 B2 | * 7/2003 | Mukherjee et al. ......... 257/762 |
| 2002/0192940 A1 | * 12/2002 | Lee et al. ................... 438/633 |
| 2003/0001240 A1 | * 1/2003 | Whitehair et al. .......... 257/638 |

OTHER PUBLICATIONS

Hu et al., *Chemical vapor deposition copper interconnections and electromigration*, Electrochemical Society Proceedings, 97–25, 1514 (1997).

Hu et al., Applied Physics Letters, vol. 74, No. 20, pp. 2945–2947 (1999).

Wang et al., *Stress-free polishing advances copper integration with ultralow-k dielectrics*, Solid State Technology, pp. 101–106, Oct. 2001.

* cited by examiner

Primary Examiner—Jasmine Clark
(74) Attorney, Agent, or Firm—Luedeka, Neely & Graham

(57) ABSTRACT

A method of forming a metal interconnect in an integrated circuit. A copper layer is formed over dielectric structures on the integrated circuit, where the dielectric structures have an upper level. The copper layer is planarized to be no higher than the upper level of the dielectric structures, without reducing the upper level of the dielectric structures. An electrically conductive capping layer is formed over all of the copper layer, without the capping layer forming over any of the dielectric structures.

15 Claims, 1 Drawing Sheet

INTERCONNECT INTEGRATION

FIELD

This invention relates to the field of integrated circuit fabrication. More particularly, this invention relates to the formation of copper metal electrical interconnects in an integrated circuit.

BACKGROUND

Consumers continually pressure integrated circuit manufacturers to provide devices that are smaller and faster, so that more operations can be performed in a given amount of time, using fewer devices that occupy a reduced amount of space and generate less heat. For many years, the integrated circuit fabrication industry has been able to provide smaller and faster devices, which tend to double in capacity every eighteen months or so.

However, as integrated circuits become smaller, the challenges of fabricating the devices tend to become greater. Fabrication processes and device configurations that didn't present any problems at a larger device size tend to resolve into new problems to be overcome as the device size is reduced. For example, in the past there was very little incentive to planarize the various layers from which integrated circuits are fabricated, and which are formed one on top of another. Because the devices themselves were relatively wide, the relatively thin layers that were formed did not present many challenges to overcome in regard to surface topography.

However, as the devices have been reduced in size they have become relatively narrower. Although layer thickness has also generally decreased, the surface topography of an underlying layer tends to create greater problems for the proper formation of the overlying layer to be formed, unless the underlying layer is planarized in some way prior to the formation of the overlying layer.

For example, chemical mechanical polishing can be used to physically and chemically erode the surface of the layer against a polishing pad in a slurry that contains both physically and chemically abrasive materials. Unfortunately, chemical mechanical polishing does not tend to produce surface topographies that are as flat as desired because, although it tends to preferentially remove higher portions of a layer, it also attacks to at least some degree the lower portions of the layer. Thus, even though the higher portions of the layer are removed at a rate that is somewhat greater than that of the lower portions, and hence some planarization does occur, there also tends to be some amount of dishing in the lower portions of the layer, where a greater amount of material is removed than is desired.

As another example of how the reduction in the size of integrated circuits has effected how the integrated circuits are fabricated, in the past the material that was predominantly—and almost exclusively—used for electrical interconnects was aluminum, because it was inexpensive and relatively easy to work with. However, as integrated circuit geometries have been reduced, some of the problems with aluminum have become more pronounced. For example, aluminum electromigration and conductivity have become larger factors. Thus, different materials are substituted for aluminum in various structures. Copper is often used because of its increased conductivity. However, there are issues to overcome with the use of copper as well.

As a specific example, chemical mechanical polishing has typically been used in the formation of copper interconnects, to planarize the deposited copper to the level of preexisting dielectric structures, such as may be formed of low k materials, and over which the copper has been deposited. Unfortunately, not only does the chemical mechanical polishing tend to dish the copper between the dielectric structures, it also tends to erode to some degree the dielectric structures themselves, especially in low density regions of such dielectric structures.

Further, copper tends to more readily diffuse into the surrounding materials that are commonly used during integrated circuit fabrication. Thus, capping layers, such as silicon nitride and silicon carbide are often deposited over a copper layer, to reduce such diffusion into overlying inter metallic dielectric layers. Unfortunately, copper tends to form only a very weak bond with the capping layer of silicon nitride or silicon carbide, and thus electromigration at the copper—capping layer interface continues to be a problem.

What is needed, therefore, is a system whereby a more robust copper interconnect is formed.

SUMMARY

The above and other needs are met by a method of forming a metal interconnect in an integrated circuit. A copper layer is formed over dielectric structures on the integrated circuit, where the dielectric structures have an upper level. The copper layer is planarized to be no higher than the upper level of the dielectric structures, without reducing the upper level of the dielectric structures. An electrically conductive capping layer is formed over all of the copper layer, without the capping layer forming over any of the dielectric structures. In this manner, the copper layer is planarized without eroding the level of dielectric structures. Further, the capping layer, which is formed only over the copper layer, reduces the degree of diffusion from the copper layer to an overlying inter metallic dielectric layer, and reduces the electromigration of the copper at the interface with the capping layer.

In various preferred embodiments, the copper is formed using electrochemical deposition. The copper layer is preferably planarized using electrochemical polishing. Preferably, the electrically conductive capping layer is formed using electroless deposition. The dielectric structures are preferably low k materials. The electrically conductive capping layer preferably includes at least one of cobalt and nickel. Preferably, an inter metallic dielectric layer is formed over the electrically conductive capping layer and the dielectric structures. A metal interconnect and an integrated circuit having a metal interconnect formed according to the method are also described.

According to another embodiment of the invention there is described a method of forming a metal interconnect in an integrated circuit. A copper layer is formed over dielectric structures on the integrated circuit. The dielectric structures have an upper level. The copper layer is formed using electrochemical deposition. The copper layer is planarized using electrochemical polishing to be no higher than the upper level of the dielectric structures, which is accomplished without reducing the upper level of the dielectric structures. An electrically conductive capping layer is formed over all of the copper layer using electroless deposition, without the capping layer forming over any of the dielectric structures.

In various preferred embodiments, the dielectric structures are formed of low k materials. The electrically conductive capping layer is preferably at least one of cobalt and nickel. An inter metallic dielectric layer is preferably formed over the electrically conductive capping layer and the dielectric structures.

According to yet another embodiment of the invention, there is described an integrated circuit with a metal interconnect. A copper layer resides between dielectric structures, where the dielectric structures have an upper level, and the upper level of the dielectric structures is substantially uniform across all of the dielectric structures. The copper layer is no higher than the upper level of the dielectric structures. An electrically conductive capping layer is disposed over all of the copper layer, but not over any of the dielectric structures. In various preferred embodiments, the capping layer is at least partially above the upper level of the dielectric structures, and the electrically conductive capping layer is formed of an alloy of at least one of cobalt and nickel.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
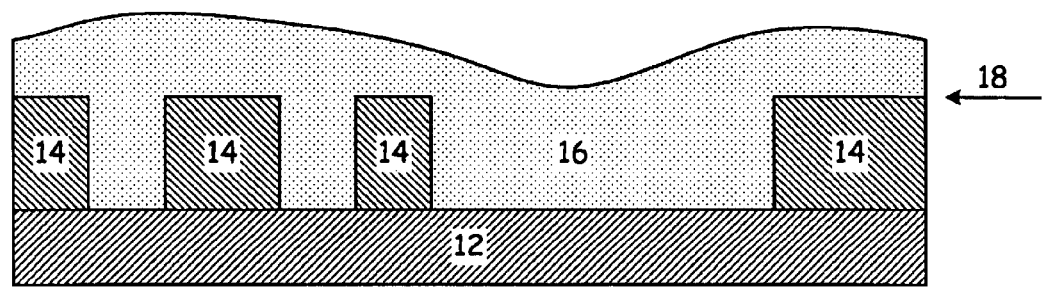
FIG. 1 is a cross sectional view of a portion of an integrated circuit, depicting a copper layer formed over dielectric structures.

With reference now to FIG. 1, there is given a cross sectional view of a portion of an integrated circuit 10, depicting a copper layer 16 formed over dielectric structures 14 on a substrate 12. It is appreciated that the substrate 12 may include a variety of layers and structures, in addition to the wafer on which the integrated circuit 10 is formed, which layers and structures are not individually identified herein so as to more clearly focus on the more relevant aspects of the invention. In preferred embodiments, the substrate 12 includes a semiconducting substrate, such as one formed of one or more of silicon, germanium, and a III–V compound such as gallium arsenide.

Dielectric structures 14 are formed on the substrate 12, such as to define electrically conductive circuit interconnections between them, in a manner as is more fully described hereafter. In a preferred embodiment, the dielectric structures 14 are formed of a low k material. The dielectric structures 14 are preferably formed having an upper level 18, which is substantially uniform across all of the dielectric structures 14.

A layer 16 of an electrically conductive material is formed over the top of the dielectric structures 14. The layer 16 is preferably formed of a metal, and is most preferably formed of copper, for the reasons as given herein. The copper layer 16 is preferably formed using an electrochemical deposition process, as it provides a copper layer 16 having the properties that are highly desirable for a metal interconnect layer.

As depicted in FIG. 1, the copper layer 16 tends to be uneven across the surface of the integrated circuit 10, and it is desired to planarize the copper layer 16 to about the upper level 18 of the dielectric structures 14. However, it is also desired to not substantially effect or otherwise alter the upper level 18 of the dielectric structures 14. As mentioned above, some planarization processes, such as chemical mechanical polishing, tend to erode such dielectric structures 14, especially relatively soft structures that are formed with low k materials, and thus alter the upper level 18 of the dielectric structures 14.

Figure 2:
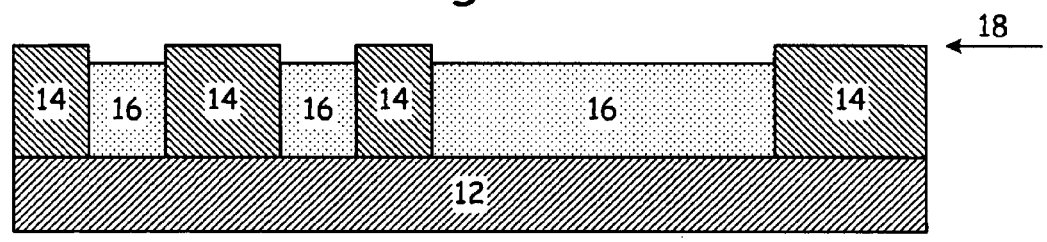
FIG. 2 is a cross sectional view of a portion of the integrated circuit, depicting the planarized copper layer and the unaffected dielectric structures.

As depicted in FIG. 2, the copper layer 16 is preferably planarized using a process that does not effect the upper level 18 of the dielectric structures, 14, which process is most preferably electrochemical polishing. As depicted in FIG. 2, the level of the copper layer 16 is preferably reduced to be at least just below the upper level 18 of the dielectric structures 14. However, the surface of the copper layer 16 is not dished, or scooped between the dielectric structures 14. Rather, the surface of the copper layer 16 tends to be relatively uniform between the dielectric structures 14, especially in comparison to the dishing that would occur during a chemical mechanical polishing process. It is again noted that this planarization of the copper layer 16 is accomplished without effecting the upper level 18 of the dielectric structures, such as rounding their upper corners or reducing their height.

Figure 3:
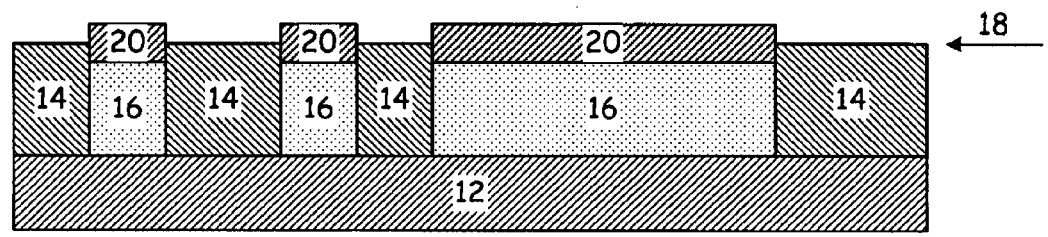
FIG. 3 is a cross sectional view of a portion of the integrated circuit, depicting the capping layer formed only over the copper layer and not over any of the dielectric structures.
Figure 4:
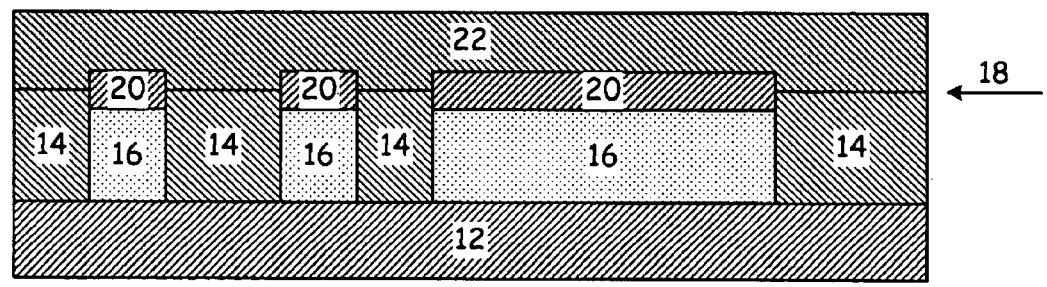
FIG. 4 is a cross sectional view of a portion of the integrated circuit, depicting an inter metallic dielectric layer formed over the capping layer and the dielectric structures.

An electrically conductive capping layer 20 is preferably formed over the copper layer 16, as depicted in FIG. 3. However, the capping layer 20 is formed only over the copper layer 16, and not over any of the dielectric structures 14. Further, the capping layer 20 is formed over all of the copper layer 16, without leaving any of it exposed. Because the capping layer 20 is not at any time formed over any of the dielectric structures 14, it does not need to be removed in any way from the upper level 18 of the dielectric structures 14. This both simplifies the processing of the integrated circuit 10, and eliminates any damage to the upper level 18 of the dielectric structures 14 that may occur during a planarization process used to remove conductive material from the upper level 18 of the dielectric structures 14. In a preferred embodiment, the capping layer 20 is formed of a metal, such as an alloy, and is most preferably formed of at least one of cobalt and nickel. In a most preferred embodiment, the capping layer 20 is formed using an electroless deposition.

In one embodiment, at least a portion of the capping layer 20 extends above the upper level 18 of the dielectric structures 14. Such a configuration could not be accomplished if the capping layer 20 were deposited on both the copper layer 16 and the dielectric structures 14, and then planarized such as with a chemical mechanical polish.

An inter metallic dielectric layer 22 is preferably formed over the top of the capping layers 20 and the dielectric structures 14. The inter metallic dielectric layer 22 may be formed of, for example, one or more of a standard dielectric material such as silicon oxide, or a low k material. In some embodiments, an ultra high k material may be desirable. The inter metallic dielectric layer can be used as well as an etch stop layer and may be formed of, for example, a silicon nitride, a silicon oxinitride, or a silicon carbide.

The capping layer 20 preferably provides at least two functions. First, the capping layer 20 preferably provides a diffusion barrier between the copper layer 16 and the material of the inter metallic dielectric layer 22. Further, the capping layer 20 preferably provides good adhesion both at the interface between the capping layer 20 and the copper layer 16 and also at the interface between the capping layer 20 and the inter metallic dielectric layer 22. Thus, the problems associated with both electromigration and inter diffusion for the interconnect structures so formed are reduced from that of prior art designs.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming a metal interconnect in an integrated circuit, the method comprising the steps of:

forming a copper layer over dielectric structures on the integrated circuit, where the dielectric structures have an upper level, planarizing the copper layer to be no higher than the upper level of the dielectric structures, without reducing the s level of the dielectric structures, and forming an electrically conductive capping layer over all of the copper layer, without the capping layer forming over any of the dielectric structures, where the electrically conductive capping Layer is formed of at least one of cobalt and nickel.

2. The method of claim 1, wherein the step of forming the copper layer comprises forming the copper layer using electrochemical deposition.

3. The method of claim 1, wherein the step of planarizing the copper layer comprises electrochemical polishing of the copper layer.

4. The method of claim 1, wherein the step of forming the electrically conductive capping layer comprises electroless deposition of the electrically conductive capping layer.

5. The method of claim 1, wherein the dielectric structures comprise low k materials.

6. The method of claim 1, further comprising the step of forming an inter metallic dielectric layer over the electrically conductive capping layer and the dielectric structures.

7. A metal interconnect formed according to the method of claim 1.

8. An integrated circuit having a metal interconnect formed according to the method of claim 1.

9. A method of forming a metal interconnect in an integrated circuit, the method comprising the steps of:

forming a copper layer over dielectric structures on the integrated circuit, where the dielectric structures have an upper level, the copper layer formed using electrochemical deposition, planarizing the copper layer to be no higher than the upper level of the dielectric structures, without reducing the upper level of the dielectric structures, the copper layer planarized using electrochemical polishing, and forming an electrically conductive capping layer over all of the copper layer, without the capping layer forming over any of the dielectric structures, the electrically conductive capping layer formed using electroless deposition.

10. The method of claim 9, wherein the dielectric structures comprise low k materials.

11. The method of claim 9, wherein the electrically conductive capping layer comprises cobalt.

12. The method of claim 9, wherein the electrically conductive capping layer comprises nickel.

13. The method of claim 9, further comprising the step of forming an inter metallic dielectric layer over the electrically conductive capping layer and the dielectric structures.

14. A metal interconnect formed according to the method of claim 9.

15. An integrated circuit having a metal interconnect formed according to the method of claim 9.

* * * * *